United States Patent
Ohba

(10) Patent No.: US 8,332,785 B2
(45) Date of Patent: Dec. 11, 2012

(54) ANALYZING APPARATUS AND ANALYZING METHOD

(75) Inventor: Takashi Ohba, Toyohashi (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 12/489,222

(22) Filed: Jun. 22, 2009

(65) Prior Publication Data

US 2010/0031207 A1 Feb. 4, 2010

(30) Foreign Application Priority Data

Jul. 29, 2008 (JP) ................................ 2008-195335

(51) Int. Cl.
*G06F 17/50* (2006.01)
(52) U.S. Cl. ........ 716/102; 716/100; 716/101; 716/104; 716/106; 716/110; 716/111; 716/112; 716/113; 716/136; 703/13; 703/14
(58) Field of Classification Search .......... 716/100–102, 716/104, 106, 110–113, 136; 703/13–22
See application file for complete search history.

(56) References Cited

U.S. PATENT DOCUMENTS

| | | | |
|---|---|---|---|
| 6,292,766 B1 * | 9/2001 | Mattos et al. ................... | 703/14 |
| 7,496,863 B2 * | 2/2009 | Levy ............................. | 716/100 |
| 7,503,017 B2 * | 3/2009 | Hosono et al. ................ | 716/111 |
| 2004/0186702 A1 * | 9/2004 | Okamoto et al. ............... | 703/14 |
| 2005/0149895 A1 * | 7/2005 | Toubou ............................ | 716/6 |

FOREIGN PATENT DOCUMENTS

| | | |
|---|---|---|
| JP | 05-266119 A | 10/1993 |
| JP | 9-128412 A | 5/1997 |
| JP | 11-250033 | 9/1999 |
| JP | 2005-339052 A | 12/2005 |

OTHER PUBLICATIONS

Japanese Office Action mailed Apr. 3, 2012 for corresponding Japanese Application No. 2008-195335, with English-language Translation.
"Japanese Office Action" mailed by JPO and corresponding to Japanese application No. 2008-195335 on Aug. 14, 2012, with English translation.
"3. Fujitsu FSPICE User'S Guide (Circuit Simulator)", Japan, Fujitsu Limited, Feb. 1993, Second edition, Section 2.6, Article 16.1, with English translation.

* cited by examiner

*Primary Examiner* — Nghia Doan
(74) *Attorney, Agent, or Firm* — Fujitsu Patent Center

(57) ABSTRACT

In an analyzing apparatus, an input accepting unit accepts input information including an analysis condition of a circuit element (circuit) to be analyzed, an analysis-SPICE-file generating unit generates an analysis SPICE file based on the input information, and an analysis-SPICE-file executing unit executes the analysis SPICE file, thereby analyzing the characteristic of the circuit element.

9 Claims, 15 Drawing Sheets

FIG.2

ANALYSIS CONDITION TABLE 150a

| TARGET CIRCUIT ELEMENT vs NAME | TERMINAL A vs VOLTAGE VALUE | TERMINAL B vs VOLTAGE VALUE | TERMINAL C vs cload | ... |
|---|---|---|---|---|
| IO-Buffer-A | 2.7 V | offset=1ns | 1 pF | ... |
| IO-Buffer-B | 2.8 V | v1=0 V | 2 pF | |
| IO-Buffer-C | 2.9 V | v2=1.2 V | 3 pF | |
| CASE 1 OF multi (1) | 3.0 V | tr=400 ps | 4 pF | |
| IO-Buffer-A | 3.1 V | tf=400 ps | CASE 1 OF multi (3) | |
| IO-Buffer-C | 3.2 V | freq=100 MHz | 5 pF | |
| IO-Buffer-E | 3.3 V | freq=200 MHz | 10 pF | |
| CASE 2 OF multi (1) | 3.4 V | freq=300 MHz | 15 pF | |
| OUT-Buffer-D | 3.5 V | duty=50 % | 20 pF | |
| CASE 3 OF multi (1) | 3.6 V | CASE 1 OF pulse (1) | CASE 2 OF multi (3) | |
| | CASE 1 OF multi (2) | offset=1ns | | |
| | 3.0 V | v1=0 V | | |
| | 3.3 V | v2=1.2 V | | |
| | 3.6 V | tr=400 ps | | |
| | CASE 2 OF multi (2) | tf=400 ps | | |
| | 1.65 V | freq=200 MHz | | |
| | 1.8 V | freq=250 MHz | | |
| | 1.95 V | freq=300 MHz | | |
| | CASE 3 OF multi (2) | duty=50 % | | |
| | | CASE 2 OF pulse (1) | | |

FIG.3

CONDITION COMBINATION TABLE
150b

| CONDITION COMBINATION (INPUT CASE NUMBER) | | | | |
|---|---|---|---|---|
| multi (1) | multi (2) | pulse (1) | multi (3) | ... |
| 1 | 1 | 1 | 1.2 | ... |
| 2 | 2 | 1.2 | 1.2 | |
| 3 | 3 | 1 | 1 | |

FIG.4A

ANALYSIS-RESULT MANAGEMENT TABLE
150c

| INPUT CONDITION | | OUTPUT CONDITION |
|---|---|---|
| OPERATION FREQUENCY | OUTPUT TERMINAL'S LOAD CAPACITANCE | OUTPUT TERMINAL'S MAXIMUM VOLTAGE VALUE |
| 100 MHz | 5 pF | 4.00 V |
| | 10 pF | 3.00 V |
| | 15 pF | 2.60 V |
| | 20 pF | 2.40 V |
| 200 MHz | 5 pF | 3.50 V |
| | 10 pF | 2.90 V |
| | 15 pF | 2.50 V |
| | 20 pF | 2.20 V |
| 300 MHz | 5 pF | 3.00 V |
| | 10 pF | 2.80 V |
| | 15 pF | 2.40 V |
| | 20 pF | 2.00 V |

FIG.4B

ANALYSIS-RESULT MANAGEMENT TABLE
150c

| INPUT CONDITION | | OUTPUT CONDITION |
|---|---|---|
| OPERATION FREQUENCY | OUTPUT TERMINAL'S LOAD CAPACITANCE | OUTPUT TERMINAL'S MAXIMUM VOLTAGE VALUE |
| 100 MHz | 5 pF | 4.00 V |
| | 10 pF | 3.00 V |
| | 15 pF | 2.60 V |
| | 20 pF | 2.40 V |
| 300 MHz | 5 pF | 3.00 V |
| | 10 pF | 2.80 V |
| | 15 pF | 2.40 V |
| | 20 pF | 2.00 V |

FIG.5A

ANALYSIS-RESULT MANAGEMENT TABLE 150c

| INPUT CONDITION | | | OUTPUT CONDITION | |
|---|---|---|---|---|
| OPERATION FREQUENCY | OUTPUT TERMINAL'S WIRING LENGTH | OUTPUT TERMINAL'S LOAD CAPACITANCE | POWER-SUPPLY TERMINAL'S MINIMUM VOLTAGE VALUE | POWER-SUPPLY TERMINAL'S MAXIMUM CURRENT VALUE |
| 100 MHz | 10 mm | 5 pF | 3.21 V | 12.77 mA |
| | 20 mm | 5 pF | 3.20 V | 12.73 mA |
| | 30 mm | 5 pF | 3.19 V | 12.69 mA |
| | 50 mm | 5 pF | 3.20 V | 12.72 mA |
| | 10 mm | 3 pF | 3.00 V | 12.23 mA |
| | 20 mm | 3 pF | 3.05 V | 12.42 mA |
| | 30 mm | 3 pF | 3.09 V | 12.61 mA |
| | 50 mm | 3 pF | 2.89 V | 12.56 mA |
| 200 MHz | 10 mm | 5 pF | 3.11 V | 11.77 mA |
| | 20 mm | 5 pF | 3.08 V | 11.67 mA |
| | 30 mm | 5 pF | 3.05 V | 11.56 mA |
| | 50 mm | 5 pF | 3.09 V | 11.66 mA |
| | 10 mm | 3 pF | 2.91 V | 11.87 mA |
| | 20 mm | 3 pF | 2.85 V | 11.94 mA |
| | 30 mm | 3 pF | 2.78 V | 12.01 mA |
| | 50 mm | 3 pF | 2.67 V | 11.98 mA |
| 300 MHz | 10 mm | 5 pF | 3.00 V | 11.06 mA |
| | 20 mm | 5 pF | 2.96 V | 11.10 mA |
| | 30 mm | 5 pF | 2.92 V | 11.13 mA |
| | 50 mm | 5 pF | 3.02 V | 10.82 mA |
| | 10 mm | 3 pF | 2.45 V | 13.19 mA |
| | 20 mm | 3 pF | 2.53 V | 11.59 mA |
| | 30 mm | 3 pF | 2.60 V | 9.99 mA |
| | 50 mm | 3 pF | 2.40 V | 10.03 mA |

FIG.5B

ANALYSIS-RESULT MANAGEMENT TABLE
150c

| INPUT CONDITION | | | OUTPUT CONDITION | |
|---|---|---|---|---|
| OPERATION FREQUENCY | OUTPUT TERMINAL'S WIRING LENGTH | OUTPUT TERMINAL'S LOAD CAPACITANCE | POWER-SUPPLY TERMINAL'S MINIMUM VOLTAGE VALUE | POWER-SUPPLY TERMINAL'S MAXIMUM CURRENT VALUE |
| 100 MHz | 10 mm | 5 pF | 3.21 V | 12.77 mA |
| | | 5 pF | | |
| | 30 mm | 5 pF | 3.19 V | 12.69 mA |
| | 50 mm | 5 pF | 3.20 V | 12.72 mA |
| | 10 mm | 3 pF | 3.00 V | 12.23 mA |
| | | 3 pF | | |
| | 30 mm | 3 pF | 3.09 V | 12.61 mA |
| | 50 mm | 3 pF | 2.89 V | 12.56 mA |
| 200 MHz | 10 mm | 5 pF | 3.11 V | 11.77 mA |
| | | 5 pF | | |
| | 30 mm | 5 pF | 3.05 V | 11.56 mA |
| | 50 mm | 5 pF | 3.09 V | 11.66 mA |
| | 10 mm | 3 pF | 2.91 V | 11.87 mA |
| | | 3 pF | | |
| | 30 mm | 3 pF | 2.78 V | 12.01 mA |
| | 50 mm | 3 pF | 2.67 V | 11.98 mA |
| 300 MHz | 10 mm | 5 pF | 3.00 V | 11.06 mA |
| | | 5 pF | | |
| | 30 mm | 5 pF | 2.92 V | 11.13 mA |
| | 50 mm | 5 pF | 3.02 V | 10.82 mA |
| | 10 mm | 3 pF | 2.45 V | 13.19 mA |
| | | 3 pF | | |
| | 30 mm | 3 pF | 2.60 V | 9.99 mA |
| | 50 mm | 3 pF | 2.40 V | 10.03 mA |

FIG.6

ANALYSIS-PURPOSE SPICE FILE (EXCERPT)

ANALYSIS SPICE FILE
150d

```
XIO-Buffer-A         node-B   node-C   node-D  (IO-Buffer-A)
VVDE                 node-A   node-D   2.7 v
VVSS                 node-D   0        0v
VPULSE               node-B   node-1   100m   PULSE  0v  1.2 v  1n  400p  400p  1n  TD=6n  10n
RPKG       node-C    node-1   1n                                                           4.6n
LPKG       node-1    0        0.1p
CPKG       node-2    node-3   0        L=0.05  Z=50
TLINE      node-3    0                         1p
CLOAD
```

11 — node-E ... 2.7 v
10 — IO-Buffer-A
12 — 0v 1.2 v 1n 400p 400p
14 — 4.6n
13 — 1p

FIG.7

| CONNECTION CONDITION | | |
|---|---|---|
| TYPE-A | | |
| TYPE-B | pulse (1) | |
| TYPE-C | | | multi (2),0 v

CONNECTION CONDITION TABLE 150e parts

FIG.8

INPUT INFORMATION

TARGET CIRCUIT ELEMENT — NAME: multi (1)

| | CONNECTION CONDITION | VOLTAGE VALUE | CURRENT VALUE | RLC-R | RLC-C | cload | T-length | T-Z0 | T-Tpd | |
|---|---|---|---|---|---|---|---|---|---|---|
| TERMINAL A | TYPE-A | multi (2) | × | × | × | × | × | × | × | ... |
| TERMINAL B | TYPE-B | pulse (1) | × | × | × | × | × | × | × | ... |
| TERMINAL C | TYPE-C | × | × | 100 mohm | 1 nH | multi (3) | 5 cm | 50 ohm | 6 ns/m | ... |
| TERMINAL D | TYPE-A | 0 V | × | × | × | × | × | × | × | ... |
| TERMINAL E | TYPE-A | 0 V | × | × | × | × | × | × | × | ... |

ANALYZING METHOD: SIMULATOR

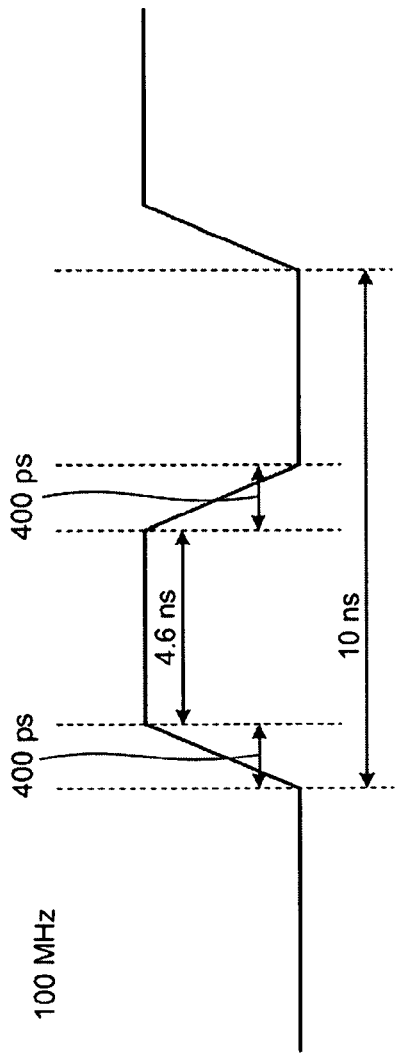

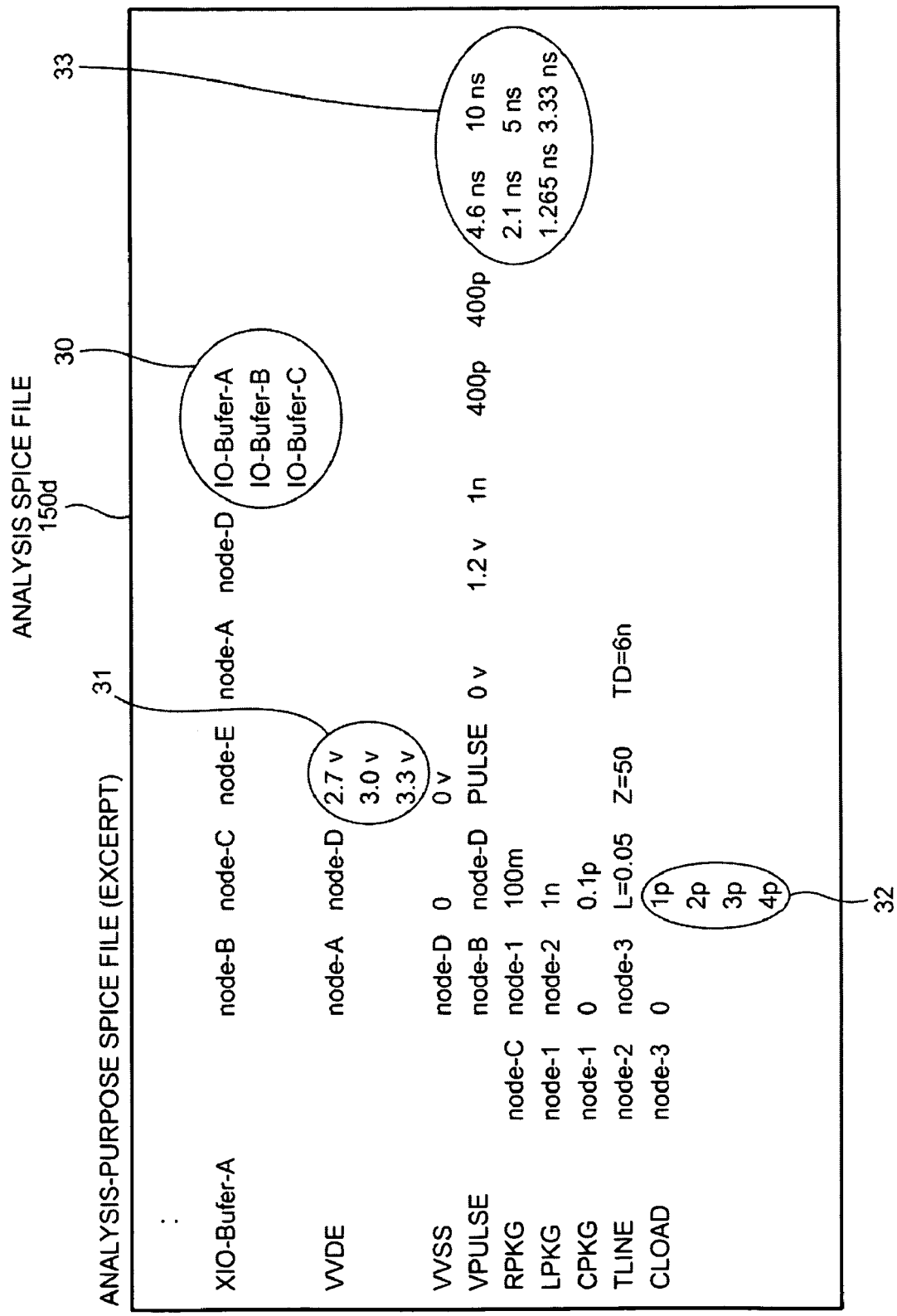

ANALYZING APPARATUS AND ANALYZING METHOD

CROSS-REFERENCE TO RELATED APPLICATION(S)

This application is based upon and claims the benefit of priority of the prior Japanese Patent Application No. 2008-195335, filed on Jul. 29, 2008, the entire contents of which are incorporated herein by reference.

FIELD

The embodiment(s) discussed herein is (are) directed to an analyzing apparatus and an analyzing method for analyzing characteristics of a circuit element.

BACKGROUND

Conventionally, for integrated circuit designing, the characteristics of circuit elements (circuits) for use in an integrated circuit have to be taken into consideration. Although the characteristics of the circuit elements under specific conditions are provided on an attached data sheet or cell characteristic table, the use conditions of the circuit elements for use in an actual integrated circuit may vary, and therefore only the characteristics of the circuit elements under the specific condition are insufficient.

For this reason, to obtain the characteristic of the circuit element under various conditions, users have to use analysis information, such as Simulation Program with Integrated Circuit Emphasis (SPICE), or Input/Output Buffer Information Specification (IBIS) of a simulation model to input operation conditions and analyze the circuit element.

In one known technology, a circuit element varied with variations of manufacturing conditions and its circuit-element value are combined together based on a design of experiment to minimize the number of times of analysis. In another known technology, a batch job is generated and executed with a model-parameter extracting procedure and a conditioned set of model parameters to reduce computer use cost.

Examples of the conventional technologies are disclosed in Japanese Laid-open Patent Publication No. 05-266119 and Japanese Laid-open Patent Publication No. 11-250033.

However, to analyze the characteristic of a circuit element under a non-specific condition by using SPICE/IBIS, expertise in description and operation of SPICE/IBIS is required. Therefore, people other than users with such expertise cannot easily obtain the characteristic of the circuit element under the non-specific condition.

SUMMARY

According to an aspect of an embodiment, an analyzing apparatus includes an analysis-condition accepting unit that accepts an analysis condition for a circuit element to be analyzed; an analysis-purpose-file generating unit that generates an analysis-purpose file based on the analysis condition; and an analyzing unit that analyzes a characteristic of the circuit element by executing the analysis-purpose file generated by the analysis-purpose-file generating unit and outputs an analysis result.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 2 is a drawing of an example of the data structure of an analysis condition table;

FIG. 3 is a drawing of an example of the data structure of a condition combination table;

FIG. 4A is a drawing of an example of the data structure of an analysis-result management table;

FIG. 4B is a drawing of an example of the data structure of the analysis-result management table before an interpolating process;

FIG. 5A is a drawing of another example of the data structure of the analysis-result management table;

FIG. 5B is a drawing of another example of the data structure of the analysis-result management table before an interpolating process;

FIG. 6 is a drawing of an example of a data structure of an analysis SPICE file;

FIG. 7 is a drawing on an example of the data structure of a connection condition table;

FIG. 8 is a drawing of an example of a screen output from an input accepting unit to an output unit;

FIG. 9 is a drawing for explaining time calculation for a flat portion of a pulse;

FIG. 10 is a drawing for explaining another data structure of the analysis SPICE file;

FIG. 11 is a drawing for explaining still another data structure of the analysis SPICE file;

DESCRIPTION OF EMBODIMENT(S)

With reference to the attached drawings, an exemplary embodiment of the analyzing apparatus and analyzing method according to the present invention are explained in detail below.

First, general outlines and features of the analyzing apparatus according to the present embodiment are explained. The analyzing apparatus according to the present embodiment accepts an analysis condition of a circuit element to be analyzed, generates an analysis-purpose file based on the accepted analysis condition, and executes the generated analysis-purpose file, thereby analyzing the characteristic of the circuit element. Here, the analysis-purpose file corresponds to, for example, circuit information when SPICE is executed or a simulation model when IBIS is executed.

Conventionally, when the characteristic of a circuit element is analyzed, a user having expertise in SPICE/IBIS has to generate an analysis file according to the analysis condition. Therefore, a general user cannot analyze the characteristic of a circuit element under a non-specific condition. Moreover, every time the analysis condition is changed, the user has to generate an analysis file again, and therefore the load on the user is large. On the other hand, the analyzing apparatus according to the present embodiment automatically generates an analysis file for analyzing the characteristic of a circuit element when accepting an input of an analysis condition. Therefore, even a user without expertise can easily analyze the characteristic of the circuit element under a non-specific condition.

In the present embodiment, by way of example, circuit elements (circuits) to be analyzed include: gate circuits, such as buffers, inverters, tri-state buffers, tri-state inverters, and gated buffers; logic circuits, such as AND, OR, NAND, NOR, EOR, and ENOR circuits; UNIT cells, such as delay buffers, flip-flop, and latch; and Input/Output (I/O) cells for external input/output buffer.

Figure 1:
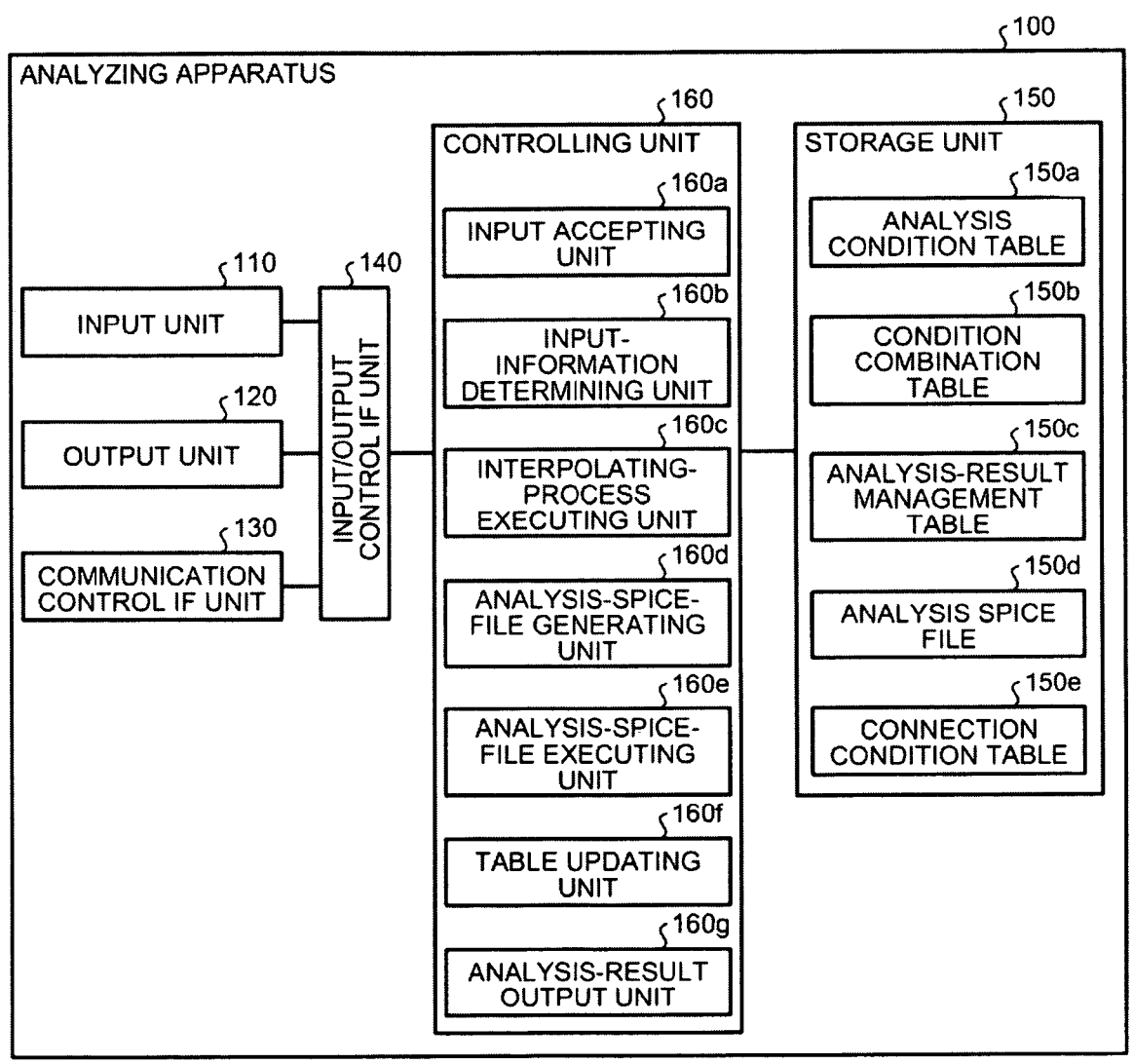
FIG. 1 is a functional block diagram of the configuration of an analyzing apparatus according to an embodiment.

Next, the configuration of the analyzing apparatus according to the present embodiment is explained. FIG. 1 is a functional block diagram of the configuration of the analyzing apparatus according to the present embodiment. As depicted in FIG. 1, the analyzing apparatus 100 includes an input unit 110, an output unit 120, a communication control interface (IF) unit 130, an input/output control IF unit 140, a storage unit 150, and a controlling unit 160.

Among these units, the input unit 110 is to input various information, such as an analysis condition of a circuit element, including a keyboard, mouse, and microphone, for example. Note that a display (output unit 120), which will be explained below, achieves a pointing-device function together with the mouse.

The output unit 120 is to output various information, including a display (or monitor or touch panel) and loudspeaker, for example. The communication control IF (interface) unit 130 is to control communication with another apparatus via a network or the like. The input/output control IF unit 140 is to control inputs and outputs of data from the input unit 110, the output unit 120, the communication control IF unit 130, the storage unit 150, and the controlling unit 160.

The storage unit 150 is to store data and programs necessary for various processes by the controlling unit 160, and includes, as depicted in FIG. 1, an analysis condition table 150a, a condition combination table 150b, an analysis-result management table 150c, an analysis SPICE file 150d, and a connection condition table 150e.

The analysis condition table 150a is a table having stored therein various information as analysis conditions of a circuit element. FIG. 2 is a drawing of an example of the data structure of the analysis condition table 150a. As depicted in FIG. 2, the analysis condition table 150a contains "target circuit element vs name", "terminal A vs voltage value", "terminal B vs voltage value", and "terminal C vs cload".

Among these, in "target circuit element vs name", names of circuit elements to be analyzed and sets of circuit elements to be analyzed are stored. With reference to FIG. 2, in "target circuit element vs name", circuit elements of "IO-Buffer-A" to "IO-Buffer E" are registered. The set of circuit elements of "IO-Buffer-A", "IO-Buffer-B", and "IO-Buffer C" is registered as Case 1 of multi(1) (multi(1) indicates a combination of "analysis target vs name", and the combination of "analysis target vs name" varies for each of Cases 1 to 3 of multi(1)), the set of circuit elements of "IO-Buffer A", "IO-Buffer-C", and "IO-Buffer E" is registered as Case 2 of multi(1), and a circuit element of "OUT-Buffer-D" is registered as Case 3 of multi(1).

In "terminal A vs voltage value", voltage values input to a terminal A of the circuit element to be analyzed or sets of voltage values are stored. With reference to FIG. 2, a set of voltage values of "2.7 volts", "2.8 volts", "2.9 volts", "3.0 volts", "3.1 volts", "3.2 volts", "3.3 volts", "3.4 volts", "3.5 volts", and "3.6 volts" is registered as voltage values for Case 1 of multi(2) (multi(2) indicates a combination of voltage values to be applied to the terminal A, and the combination of voltage values to be applied to the terminal A varies for each of Cases 1 to 3 of multi(2)). In Case 1 of multi(2), two voltage values of "2.8 volts" and "2.9 volts" are voltage values interpolated between "2.7 volts" and "3.0 volts", two voltage values of "3.1 volts" and "3.2 volts" are those interpolated between "3.0 volts" and "3.3 volts", and two voltage values of "3.4 volts" and "3.5 volts" are those interpolated between "3.3 volts" and "3.6 volts". In FIG. 2, these interpolated voltage values are shaded.

An interpolating process in "terminal A vs voltage value" is executed, for example, after each voltage value is input by a user into the analysis condition table 150a and a simulation is performed. Then, with voltage values found through the interpolating process, a simulation is performed again. In this manner, with such interpolation among the voltage values, an analysis can be performed under a condition of which the administrator is unaware or a condition similar to the condition specified by the administrator.

In Case 1 of multi(2) before an interpolating process is executed, the set of voltage values has "2.7 volts", "3.0 volts", and "3.3 volts". With the execution of the interpolating process, a set of voltage values of "2.8 volts", "2.9 volts", "3.1 volts", "3.2 volts", "3.4 volts", and "3.5 volts" is added to Case 1 of multi(2).

Also, a set of voltage values of "3.0 volts", "3.3 volts", and "3.6 volts" is registered as voltage values for Case 2 of multi (2), and a set of voltage values of "1.65 volts", "1.8 volts", and "1.95 volts" is registered as voltage values for Case 3 of multi(2).

In "terminal B vs voltage value", characteristics of voltage values to be input to a terminal B of the circuit element to be analyzed are stored. With reference to FIG. 2, a set of an offset of "1 nanosecond", V1 of "0 volt", V2 of "1.2 volts" (in the case of two types of input voltage), a voltage rising time tr of "400 picoseconds", a voltage falling time tf of "400 picoseconds", a frequency of "100 megahertz", "200 megahertz", or "300 megahertz", and a duty of "50%" is registered as Case 1 of pulse(1) (pulse(1) indicates a combination of the voltage values to be applied to the terminal B, the voltage rising time, the voltage falling time, the frequency, and the duty, and the combination of the voltage values to be applied to the terminal B, the voltage rising time, the voltage falling time, the frequency, and the duty varies for each of Cases 1 and 2 of pulse(1)).

Also, a set of an offset of "1 nanosecond", V1 of "0 volt", V2 of "1.2 volts" (in the case of two types of input voltage), a voltage rising time tr of "400 picoseconds", a voltage falling time tf of "400 picoseconds", a frequency of "200 megahertz", "250 megahertz", or "300 megahertz", and a duty of "50%" is registered as Case 2 of pulse(1). Note that the frequency of "250 megahertz" is a frequency interpolated between the frequencies of "200 megahertz" and "300 megahertz".

In "terminal C vs cload", a set of capacitances connected to a terminal C of the circuit element to be analyzed is stored. With reference to FIG. 2, a set of capacitances of "1 picofarad", "2 picofarads", "3 picofarads", and "4 picofarads" is registered as Case 1 of multi(3) (multi(3) indicates a combination of capacitances connected to the terminal C, and the combination of capacitances connected to the terminal C varies for each of Cases 1 and 2 of multi(3)), and a set of capacitances of "5 picofarads", "10 picofarads", "15 picofarads", and "20 picofarads" is registered as Case 2 of multi(3). Note that the capacitances of "15 picofarads" is a capacitance interpolated between the capacitances of "10 picofarads" and "20 picofarads".

The condition combination table 150b is a table for managing combinations of the cases depicted in FIG. 2. The condition combination table 150b is assumed to be set in advance by a user. FIG. 3 is a drawing of an example of the data structure of the condition combination table 150b.

For example, with reference to the first row in FIG. 3, Case 1 of multi (1), Case 1 of multi(2), Case 1 of pulse(3), and Cases 1 and 2 of multi(4) are combined together. When a combination as depicted in the first row in FIG. 3 (Case 1 of multi (1), Case 1 of multi(2), Case 1 of pulse(1), and Cases 1 and 2 of multi(3)) is set, the number of combinations of "IO-Buffer-A", "IO-Buffer-B", and "IO-Buffer-C" included in Case 1 of multi(1), "2.7 volts", "2.8 volts", "2.9 volts", "3.0 volts", "3.1 volts", "3.2 volts", "3.3 volts", "3.4 volts", "3.5 volts", and "3.6 volts" included in Case 1 of multi(2), the offset of "1 nanosecond", V1 of "0 volt", V2 of "1.2 volts", the voltage rising time tr of "400 picoseconds", the voltage falling time tf of "400 picoseconds", the frequency of "100 megahertz", "200 megahertz", or "300 megahertz", and the duty of "50%" included in Case 1 of pulse(1), and "1 picofarad", "2 picofarads", "3 picofarads", "4 picofarads", "5 picofarads", "10 picofarads", "15 picofarads", and "20 picofarads" included in Cases 1 and 2 of multi(3) is 720 in total.

The analysis-result management table 150c is a table having stored therein an analysis condition for a circuit element and the analysis result in association with each other. FIGS. 4A and 5A are drawings of examples of the data structure of the analysis-result management table 150c. As depicted in FIGS. 4A and 5A, this analysis-result management table 150c includes an input condition and output condition.

For example, as depicted in the first row in FIG. 4A, what is registered is that, in the state where "operation frequency" and "output terminal's load capacitance (load capacitance connected to the output terminal)" are set as input conditions and "output terminal's maximum voltage value (maximum voltage of the output terminal)" is set as an output condition, when "100 megahertz" is input as the operation frequency and "5 picofarads" is input as the output terminal's load capacitance, the output terminal's maximum voltage value is "4.00 volts". In this case, this means that the analysis result indicates "4.00 volts".

Also as depicted in the first row in FIG. 5A, what is registered is that, in the state where "operation frequency", "output terminal's wiring length", and "output terminal's load capacitance" are set as input conditions and "power-supply terminal's minimum voltage value", "power-supply terminal's maximum voltage value" are set as output conditions, when "100 megahertz" is input as the operation frequency, "10 millimeters" is input as the output terminal's wiring length, and "5 picofarads" is input as the output terminal's load capacitance, the power-supply terminal's minimum voltage is "3.21 volts" and the power-supply terminal's maximum current value is "12.77 milliamperes". In this case, this means that the analysis result indicates 3.21 volts and 12.77 milliamperes.

Also, numerical values shaded in FIGS. 4A and 5A are those obtained as a result of an interpolating process by an interpolating-process executing unit 160c, which will be explained further below. FIGS. 4B and 5B are drawings of examples of the data structure of the analysis-result management table 150c before an interpolating process. Note that FIGS. 4A and 4B correspond to each other, whilst FIGS. 5A and 5B correspond to each other.

The analysis SPICE file 150d is an analysis file generated by an analysis-SPICE-file generating unit 160d (which will be explained further below). FIG. 6 is a drawing of an example of a data structure of the analysis SPICE file 150d.

The analysis SPICE file 150d depicted in FIG. 6 corresponds to circuit information for use when SPICE, which is a simulator, analyzes the characteristic of a circuit element (circuit). Conventionally, a user having expertise has to use the input unit 110 to directly generate the analysis SPIC file 150d. However, the analyzing apparatus 100 according to the present embodiment generates the analysis SPICE file 150d based on the analysis condition specified by the user. Therefore, even a general user without expertise can easily analyze the characteristic of the circuit element.

FIG. 6 depicts that "IO-Buffer-A" is registered in an area 10 as "target circuit element vs name", "2.7 volts" is registered in an area 11 as "terminal A vs voltage value", and values corresponding to "terminal B vs voltage value" are registered in an area 12. Also, "1 picofarad" is registered in an area 13 as "terminal C vs cload", and time and period of a flat portion of a pulse input to the circuit element to be analyzed are registered in an area 14.

The connection condition table 150e stores data for managing data corresponding to a connection condition for a terminal. FIG. 7 is a drawing of an example of the data structure of a connection condition table 150e. In the example of FIG. 7, when "TYPE-A" is set as a connection condition of the terminal, a circuit including a grounding terminal, a power supply, a voltmeter, and others is connected to the terminal.

When multi(2) is set to "TYPE-A", for example, a set of voltage values of "2.7 volts", "2.8 volts", "2.9 volts", "3.0 volts", "3.1 volts", "3.2 volts", "3.3 volts", "3.4 volts", "3.5 volts", and "3.6 volts" is input to the circuit element to be analyzed. Alternatively, the user may specify a specific voltage, such as "0 volt".

When "TYPE-B" is set as a connection condition for the terminal, a circuit element including a grounding terminal, a pulse source, a voltmeter, and others is connected to the terminal. When pulse(1) is set to "TYPE-B", for example, a set of the offset of "1 nanosecond", V1 of "0 volt", V2 of "1.2 volts" (in the case of two types of input voltage), the voltage rising time tr of "400 picoseconds", the voltage falling time tf of "400 picoseconds", the frequency of "100 megahertz", "200 megahertz", or "300 megahertz", and the duty of "50%" is input to the circuit element to be analyzed.

When "TYPE-C" is set to the connection condition of the terminal, a circuit element including an resistance-inductance-capacitance (RLC) model, a T model, and a capacitor (cload) is connected to the terminal. Note that information about other components is also registered as parts to the connection condition table. As with "TYPE-A" and "TYPE-B", "TYPE-C" may be set with multi(3) and a set of capacitances may be input.

On the other hand, a column of "parts" has registered therein, for example, an ammeter, a voltmeter, a direct-current power supply, an alternating-current power supply, a current source, a pulse source, a single-shot pulse source, a (irregular) pulse source, a constant-current source, a grounding terminal, a resistance, an inductor, a capacitor, a white circle (connecting point with the circuit element to be analyzed), a black circle (connecting point), an RLC model, an resistance-inductance-conductance-capacitance (RLGC) model, a T model, a W model, a U model, and an S model. For example, the user can operate the input unit 110 as required to register components in the "parts" column to any of the connection conditions of "TYPE-A", "TYPE-B", and "TYPE-C".

The controlling unit 160 includes an internal memory for storing programs and control data defining various process procedures, and executes various process with these programs and control data. As depicted in FIG. 1, the controlling unit 160 includes an input accepting unit 160a, an input-information determining unit 160b, the interpolating-process executing unit 160c, the analysis-SPICE-file generating unit 160d, an analysis-SPICE-file executing unit 160e, a table updating unit 160f, and an analysis-result output unit 160g.

The input accepting unit 160a outputs an analysis-condition input screen to the output unit 120, thereby causing the user to select and input an analysis condition. In the following, information selected and input by the user is referred to as input information. When accepting input information, the input accepting unit 160a outputs the input information to the input-information determining unit 160b.

When the input information contains multi(1), multi(2), multi(3), and pulse(1), the input accepting unit 160a extracts any relevant analysis condition based on the analysis condition table 150a and contains the extracted analysis condition in the input information.

FIG. 8 is a drawing of an example of an input screen output from the input accepting unit 160a. When the input screen depicted in FIG. 8 is output to the output unit 120, the user uses the input unit 110 to input or select information for each item. In the example depicted in FIG. 8, "multi(1)" is selected in a "target circuit element" column. Therefore, the circuit elements to be analyzed are a set of circuit elements of "IO-Buffer-A", "IO-Buffer-B", and "IO-Buffer-C" for Case 1, a set of circuit elements of "IO-Buffer-A", "IO-Buffer-C", and "IO-Buffer-E" for Case 2, and an element of "OUT-Buffer-D" for Case 3 (refer to FIG. 2).

Next, "TYPE-A" is selected as a connection condition for the terminal A of the circuit element, and "multi(2)" is selected as a voltage value input to the terminal A. Therefore, the voltage values input to the terminal A of the circuit element are a set of voltage values of "2.7 voltages to 3.6 voltages" for Case 1, a set of voltage values of "3.0 voltage, 3.3 voltages, and 3.6 voltages" for Case 2, and a set of voltages of "1.65 voltages, 1.8 voltages, and 1.95 voltages" for Case 3 (refer to FIG. 2).

Next, "TYPE-B" is selected as a connection condition for the terminal B, and "pulse(1)" is selected as a voltage value input to the terminal B. Therefore, the characteristics of the voltage values input to the B terminal of the circuit element are represented by a set of an offset of "1 nanosecond", V1 of "0 volt", V2 of "1.2 volts" (in the case of two types of input voltage), a voltage rising time tr of "400 picoseconds", a voltage falling time tf of "400 picoseconds", a frequency of "100 megahertz", "200 megahertz", or "300 megahertz", and a duty of "50%" for Case 1.

On the other hand, for Case 2, the characteristics of the voltage values input to the B terminal of the circuit element are represented by a set of an offset of "1 nanosecond", V1 of "0 volt", V2 of "1.2 volts" (in the case of two types of input voltage), a voltage rising time tr of "400 picoseconds", a voltage falling time tf of "400 picoseconds", a frequency of "200 megahertz", "250 megahertz", or "300 megahertz", and a duty of "50%".

Next, "TYPE-C" is selected as a connection condition for the terminal C. The resistance value of the RLC model connected to the terminal C is "100 megohms", the inductance of the RLC model is "1 nanohenry", the capacitance of the RLC model is "0.1 picofarads", the capacitance (cload) of the terminal C is "multi(3)", the wiring length (T-length) of the terminal C is 5 centimeters, the impedance (T-Z0) of the wiring of the terminal C is "50 ohms", and the voltage delay time per unit time (T-Tpd) of the wiring of the terminal C is "6 ns/m".

Also, "multi(3)" is set as a capacitance "cload" of the terminal C. Therefore, the capacitances (cload) of the terminal C are a set of "1 picofarad to 4 picofarads" for Case 1, and a set of "5 picofarads, 10 picofarads, 15 picofarads, and 20 picofarads" for Case 2.

Next, "TYPE-A" is set as a connection condition for the terminal D, and "0 volt" is set as a voltage value input to the terminal C. Also, "TYPE-A" is set as a connection condition for the terminal E, and "0 volt" is set as a voltage value input to the terminal E. Here, each cross in FIG. 8 indicates that no condition is set.

In an analyzing method section, information is registered indicating whether to execute an analysis of the circuit element with the analysis conditions depicted in FIG. 6 by a simulator or an interpolating process (or both of a simulator and an interpolating process). In the example depicted in FIG. 8, the information registered in the analyzing method section indicates that an analysis of the circuit element is to be performed by a simulator.

Here, although explanation is omitted, it is assumed in FIG. 8 that the user can set an output condition and others (refer to FIGS. 4 and 5) as input information.

When obtaining input information from the input accepting unit 160a, the input-information determining unit 160b refers to the analysis conditions contained in the input information to determine whether any analysis condition identical to the analysis condition in the input information is registered in the analysis-result management table 150c.

When the analysis condition identical to that in the input information is registered in the analysis-result management table 150c, the input-information determining unit 160b extracts data associated with the analysis condition as an analysis result, and then outputs the analysis result to the analysis-result output unit 160g.

For example, in the analysis condition contained in the input information, when "operation frequency" and "output terminal's load capacitance" are set as input conditions and "output terminal's maximum voltage value" is set as an output condition and when "100 megahertz" is set as an operation frequency of the input condition and "5 picofarads" is set as an output terminal's load capacitance, "4.00 volts" can be obtained as an output terminal's maximum voltage value of the output condition even without a simulation or an interpolating process (refer to FIGS. 4A and 4B).

Therefore, when "operation frequency" and "output terminal's load capacitance" are set as input conditions and "output terminal's maximum voltage value" is set as an output condition and when "100 megahertz" is set as an operation frequency of the input condition, and "5 picofarads" is set as an output terminal's load capacitance, the input-information determining unit 160b outputs input conditions of <operation frequency of "100 megahertz" and output terminal's load capacitance of "5 picofarads"> and an output condition of <output terminal's maximum voltage value of "4 volts"> as an analysis result to the analysis-result output unit 160g.

On the other hand, when determining that no analysis condition identical to the analysis condition in the input information is registered in the analysis-result management table 150c, the input-information determining unit 160b outputs the input information to either one or both of the interpolating-process executing unit 160c and the analysis-SPICE-file generating unit 160d according to the analyzing method.

Specifically, the input-information determining unit 160b outputs the input information to the interpolating-process executing unit 160c when the analyzing method is an "interpolating process", and outputs the input information to the analysis-SPICE-file generating unit 160d when the analyzing method is a "simulator". When the analyzing method is "interpolating process and simulator", the input-information determining unit 160b outputs the input information to the interpolating-process executing unit 160c and the analysis-SPICE-file generating unit 160d.

When obtaining the input information, the interpolating-process executing unit 160c executes an interpolating process based on the input information and the analysis-result management table 150c, and then registers the result of the interpolating process in the analysis-result management table 150c and outputs the result of the interpolating process to the analysis-result output unit 160g as an analysis result.

An example of the interpolating process is now explained when an operation frequency of "200 megahertz" and an output terminal's load capacitance of "5 picofarads" are set as input conditions contained in the input information and "output terminal's maximum voltage value" is set as an output condition.

With reference to FIG. 4A, the output terminal's maximum voltage value as an output condition is "4.00 volts" for an operation frequency of "100 megahertz" and an output terminal's load capacitance of "5 picofarads" as input conditions, and the output terminal's maximum voltage value as an output condition is "3.00 volts" for an operation frequency of "300 megahertz" and an output terminal's load capacitance of "5 picofarads" as input conditions. Therefore, "3.50 volts", which is a mean value between "3.00 volts" and "4.00 volts", is obtained as a result of the interpolating process. The data structure before the interpolating process is as depicted in FIG. 4B.

An interpolating process when an operation frequency of "200 megahertz" and output terminal's load capacitances of "10 picofarads, 15 picofarads, and 20 picofarads" are set as input conditions contained in the input information and "output terminal's maximum voltage value" is set as an output condition is executed also with the technique explained above.

Another example of the interpolating process is now explained when an operation frequency of "100 megahertz", an output terminal's wiring length of "20 millimeters", and an output terminal's load capacitance of "5 picofarads" are set as input conditions contained in the input information and "power-supply terminal's minimum voltage value" and "power-supply terminal's maximum current value" are set as output conditions.

First, an interpolating process for "power-supply terminal's minimum voltage value" is explained. The power-supply terminal's minimum voltage value as an output condition is "3.21 volts" for an operation frequency of "100 megahertz", an output terminal's wiring length of "10 millimeters", and an output terminal's load capacitance of "5 picofarads" as input conditions, and the power-supply terminal's minimum voltage value as an output condition is "3.19 volts" for an operation frequency of "100 megahertz", an output terminal's wiring length of "30 millimeters", and an output terminal's load capacitance of "5 picofarads" as input conditions. Therefore, "3.20 volts", which is a mean value between "3.19 volts" and "3.21 volts", is obtained as a result of the interpolating process (refer to FIGS. 5A and 5B).

Next, an interpolating process for "power-supply terminal's maximum current value" is explained. The power-supply terminal's maximum current value as an output condition is "12.77 milliamperes" for an operation frequency of "100 megahertz", an output terminal's wiring length of "10 millimeters", and an output terminal's load capacitance of "5 picofarads" as input conditions, and the power-supply terminal's maximum current value as an output condition is "12.69 milliamperes" for an operation frequency of "100 megahertz", an output terminal's wiring length of "30 millimeters", and an output terminal's load capacitance of "5 picofarads" as input conditions. Therefore, "12.73 milliamperes", which is a mean value between "12.69 milliamperes" and "12.77 milliamperes", is obtained as a result of the interpolating process.

Here, the interpolating process performed by the interpolating-process executing unit 160c may be executed by finding a mean value (for example, a mean value between successive values) as explained above, or may be executed by using another known technique. When registering the result of the interpolating process in the analysis-result management table 150c, the interpolating-process executing unit 160c uses a flag or the like (not depicted in the drawings) to also register information indicating that the result is represented by values found through an interpolating process. In FIGS. 4A, 4B, 5A, and 5B, shaded values are those calculated through an interpolating process.

When accepting the input information, the analysis-SPICE-file generating unit 160d generates an analysis SPICE file 150d based on the input information. For example, the analysis-SPICE-file generating unit 160d retains a template or model file, and registers various conditions contained in the input information in the previously-set template file to generate the analysis SPICE file 150d.

For example, when analysis conditions contained in the input information are set as "target circuit element vs name" of "IO-Buffer-A", "terminal A vs voltage value" of "2.7 volts", "terminal B vs voltage value" of "offset<1 nanosecond>, v1<0 volt>, v2<1.2 volts>, tr<400 picoseconds>, tf<400 picoseconds>, freq<100 megahertz>, duty<50%>", and "terminal C vs cload" of "1 picofarads", the analysis SPICE file 150d is as depicted in FIG. 6.

With reference to FIG. 6, "IO-Buffer-A" is registered in the area 10 as "target circuit element vs name", "2.7 volts" is registered in the area 11 as "terminal A vs voltage value", and values corresponding to "terminal B vs voltage value" are registered in the area 12. In the area 13, "1 picofarad" is registered as "terminal C vs cload". In the area 14, time and period of a flat portion of a pulse input to the circuit element to be analyzed are registered.

FIG. 9 is a drawing for explaining time calculation for a flat portion of a pulse. As depicted in FIG. 9, when a signal has 100 megahertz, one period of the signal is 10 nanoseconds. Also, the rising time tr is 400 picoseconds and the falling time tf is 400 picoseconds. When the duty is 50%, the time for the flat portion of the pulse is represented as:

(10 nanoseconds/2)−400 picoseconds=4.6 nanoseconds.

Next, other data structures of the analysis SPICE file 150d are explained. FIGS. 10 and 11 are drawings for explaining other data structures of the analysis SPICE file 150d.

When analysis conditions contained in the input information are set as "target circuit element vs name" of "IO-Buffer-A", "terminal A vs voltage value" of "2.7 volts", "terminal B vs voltage value" of "offset<1 nanosecond>, v1<0 volt>, v2<1.2 volts>, tr<400 picoseconds>, tf<400 picoseconds>, freq<100 megahertz>, duty<50%>", and "terminal C vs cload" of "2 picofarads", the analysis SPICE file 150d is as depicted in FIG. 10.

With reference to FIG. 10, "IO-Buffer-A" is registered in an area 20 as "target circuit element vs name", "2.7 volts" is registered in an area 21 as "terminal A vs voltage value", and values corresponding to "terminal B vs voltage value" are registered in an area 22. In an area 23, "2 picofarads" is registered as "terminal C vs cload". In an area 24, time (4.6 nanoseconds) and period (10 nanoseconds) of a flat portion of a pulse input to the circuit element to be analyzed are registered.

The analysis SPICE file 150d corresponding to a combination on the first row of the condition combination table 150b (refer to FIG. 8) with analysis conditions contained in the input information as depicted in FIG. 8 is as depicted in FIG. 11.

With reference to FIG. 11, "IO-Buffer-A, IO-Buffer-B, and IO-Buffer-C" is registered in an area 30 as "target circuit element vs name", and "2.7 volts, 3.0 volts, and 3.3 volts" are registered in an area 31 as "terminal A vs voltage value". Also, in an area 32, "1 picofarad, 2 picofarads, 3 picofarads, and 4 picofarads" are registered as "terminal C vs cload". In an area 33, times and periods of a flat portion of a pulse for 100 megahertz, 200 megahertz, and 300 megahertz are registered.

Figure 12:
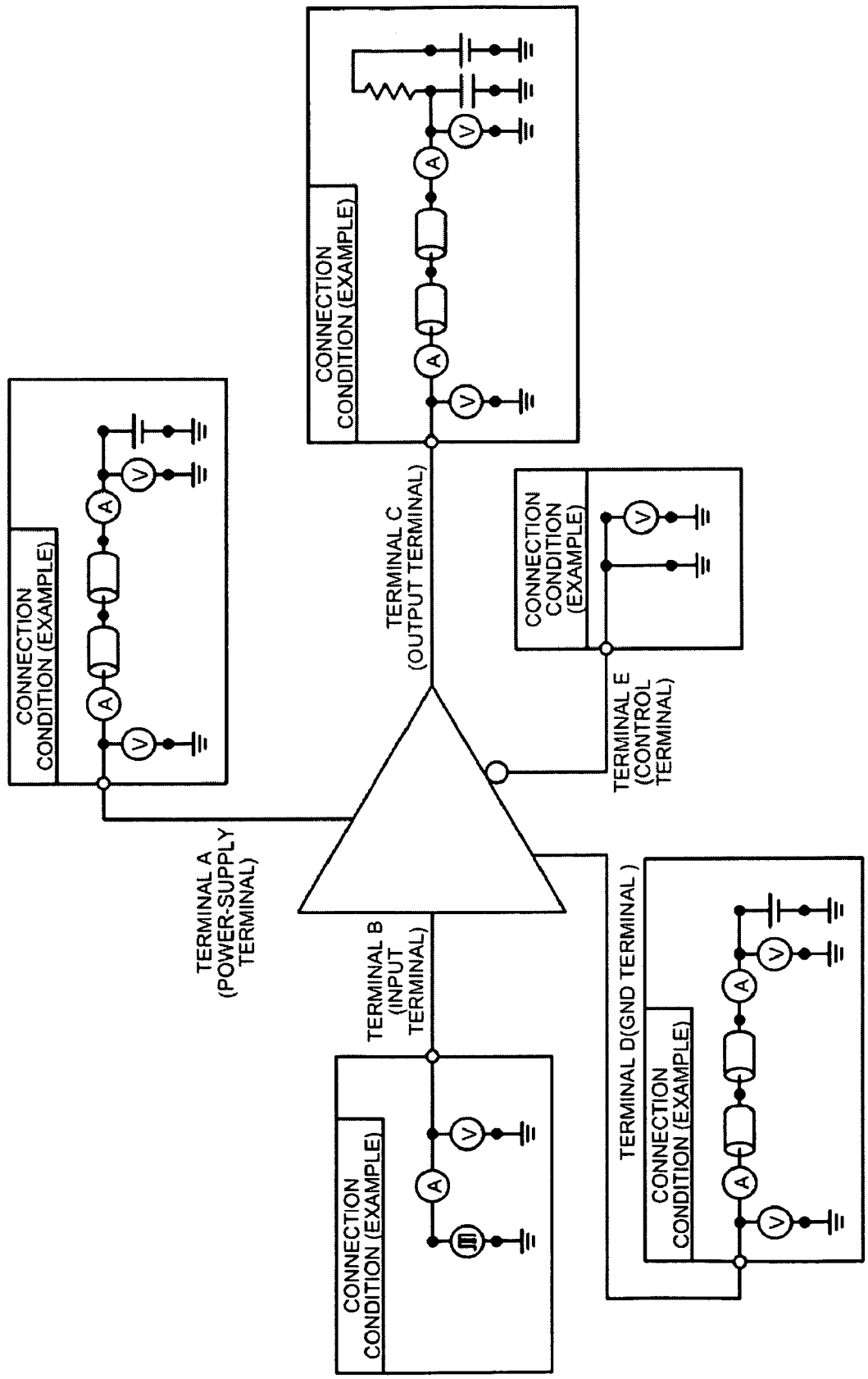
FIG. 12 is a drawing of an example of an analysis model corresponding to the analysis SPICE file.

FIG. 12 is a drawing of an example of an analysis model corresponding to the analysis SPICE file 150d. The analysis-SPICE-file generating unit 160d may generate an analysis model in place of an analysis SPICE file 150d, based on the input information.

In the analysis model depicted in FIG. 12, each terminal of a circuit element to be analyzed has connected thereto a circuit based on the connection conditions (refer to FIG. 8). For example, a terminal A (power-supply terminal) of the analysis-target circuit element has connected thereto a circuit model corresponding to a connection condition of "TYPE-A", whilst a terminal B (input terminal) of the analysis-target circuit element has connected thereto a circuit model corresponding to a connection condition of "TYPE-B".

Furthermore, a terminal C (output terminal) of the analysis-target circuit element has connected thereto a circuit model corresponding to a connection condition of "TYPE-C", a terminal D (grounding (GND) terminal) of the analysis-target circuit element has connected thereto a circuit model corresponding to the connection condition of "TYPE-A", and a terminal E (control terminal) of the analysis-target circuit element has connected thereto a circuit model corresponding to the connection condition of "TYPE-A". Information about each circuit model is stored in the connection condition table 150e.

The analysis-SPICE-file executing unit 160e executes the analysis SPICE file 150d in a manner as that of a known SPICE simulator, thereby analyzing the characteristic of the circuit element (circuit). The analysis-SPICE-file executing unit 160e outputs the analysis result and input information to the table updating unit 160f and the analysis-result output unit 160g. Alternatively, the analysis-SPICE-file executing unit 160e may use an analysis model (refer to FIG. 12) to analyze the characteristic of the circuit element.

The table updating unit 160f updates the analysis-result management table 150c based on the input information and the analysis result. Specifically, the table updating unit 160f compares the analysis conditions contained in the input information and the analysis-result management table 150c to determine whether the analysis result corresponding to the analysis condition has already been registered.

If the analysis result corresponding to the analysis condition has not been registered in the analysis-result management table 150c, the table updating unit 160f registers the analysis result corresponding to the analysis conditions obtained from the analysis-SPICE-file executing unit 160e to the analysis-result management table 150c.

On the other hand, if the analysis result corresponding to the analysis condition has been registered in the analysis-result management table 150c, the table updating unit 160f determines based on the presence or absence of a flag whether the registered analysis result is an analysis result obtained as a result of executing an interpolating process. If the analysis result registered in the analysis-result management table 150c is an analysis result obtained as a result of executing an interpolating process, the table updating unit 160f performs an update with the analysis result obtained from the analysis-SPICE-file executing unit 160e. In other words, the table updating unit 160f updates the analysis result from the interpolating-process executing unit 160c with the analysis result from the analysis-SPICE-file executing unit 160e.

Figure 13:
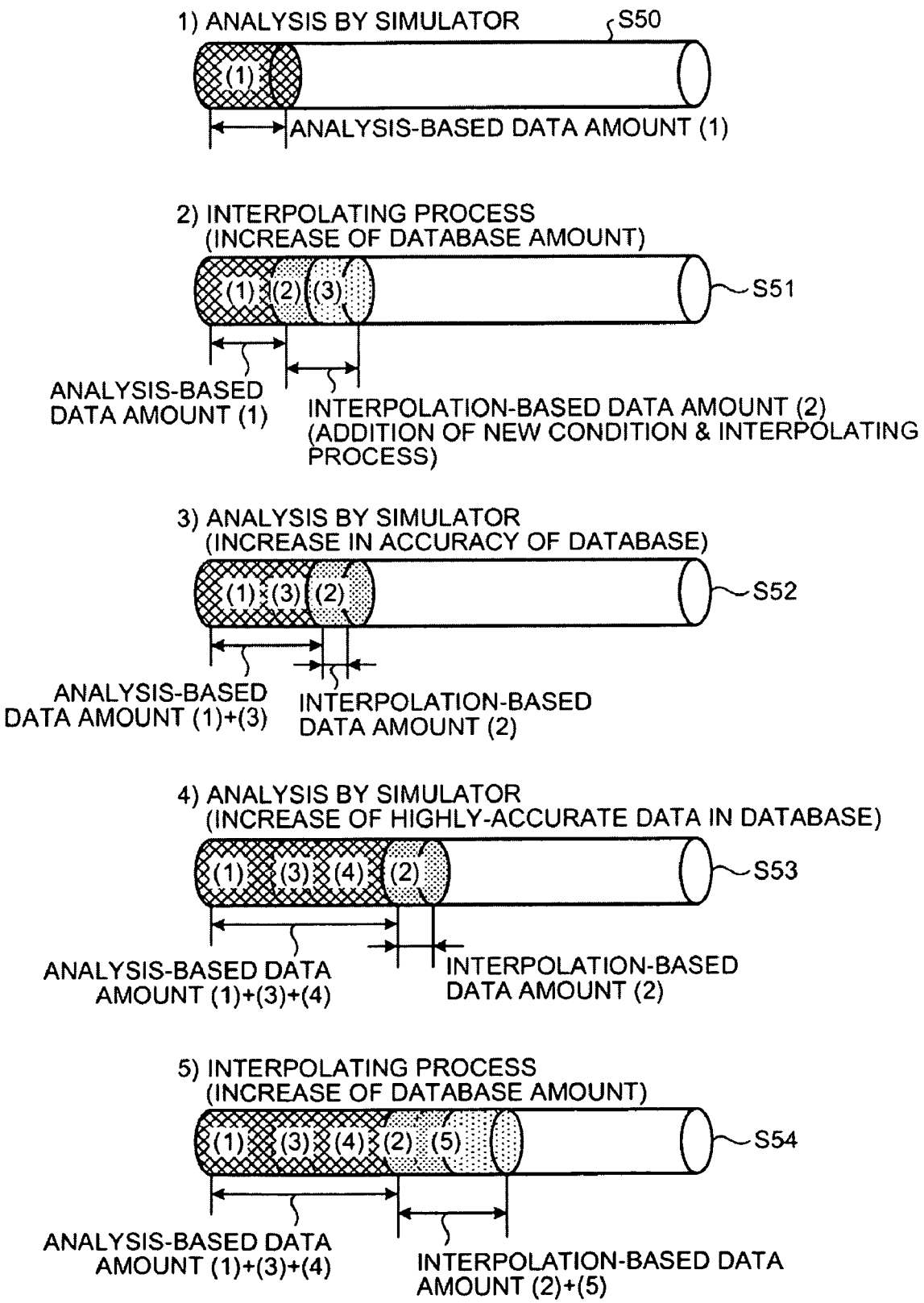
FIG. 13 is a drawing for explaining details of data in the analysis-result management table.

The details of data in the analysis-result management table 150c to be updated by the table updating unit 160f is now explained. FIG. 13 is a drawing for explaining details of data in the analysis-result management table 150c. As depicted in FIG. 13, the analysis-SPICE-file executing unit 160e executes a process, and data (1) is registered in the analysis-result management table 150c (step S50).

Also, the interpolating-process executing unit 160c executes an interpolating process, and data (2) indicative of an analysis result with an intermediate accuracy and data (3) indicative of an analysis result with a low accuracy are registered in the analysis-result management table 150c (step S51). Note that the accuracy of the interpolating process varies according to the type of the interpolating process.

Next, when the analysis result from the analysis-SPICE-file executing unit 160e is generated with the same analysis conditions as those for the data (3), data (3) obtained from the interpolating process is replaced by data (3) obtained by the analysis-SPICE-file executing unit 160e (step S52).

The analysis-SPICE-file executing unit 160e then generates an analysis result with new conditions, and registers the generated analysis result in the analysis-result management table 150c as data (4) (step S53). The interpolating-process executing unit 160c then executes an interpolating process, and registers data (5) with an intermediate accuracy and a low accuracy in the analysis-result management table 150c (step S54).

By repeating a simulation and an interpolating process in this manner, the accuracy of the analysis results is increased. Also, with accumulation of data of the analysis results, a range where an interpolating process can be executed is widened.

Figure 14:
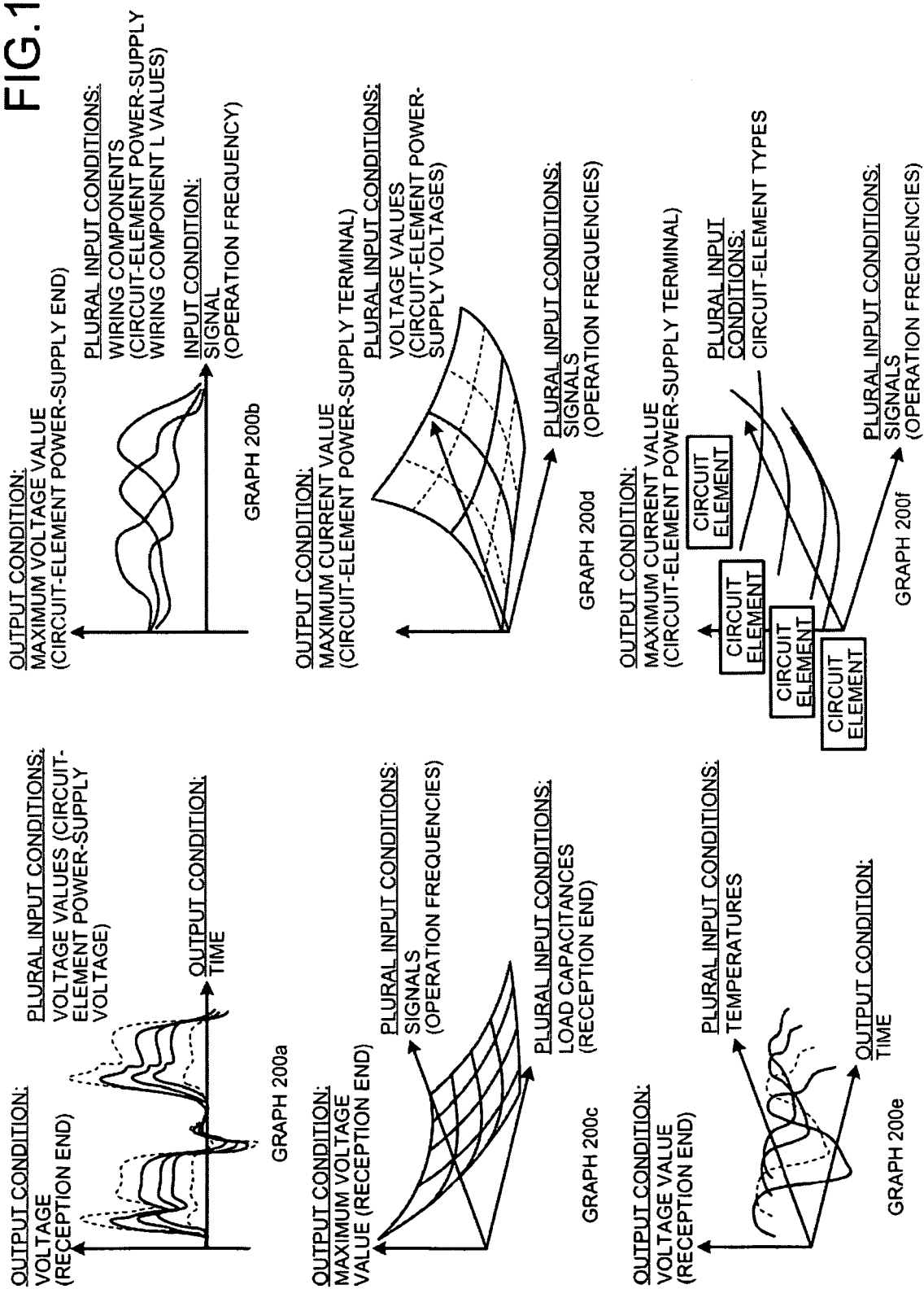
FIG. 14 is a drawing of an output example of the analysis result from an analysis-result output unit.

Returning to the explanation of FIG. 1, the analysis-result output unit 160g is to output an analysis result from the interpolating-process executing unit 160c or an analysis result from the analysis-SPICE-file executing unit 160e. The analysis-result output unit 160g displays the analysis result in graph according to the analysis conditions, such as input conditions and output conditions set by the user. FIG. 14 is a drawing of an output example of the analysis result from the analysis-result output unit 160c and the interpolating-process executing unit 160c.

With reference to FIG. 14, in a graph 200a, a plurality of voltage values (circuit-element power-supply voltages) are set as input conditions, and a voltage value (reception end) and time are set as output conditions. Here, the analysis results from the analysis-SPICE-file executing unit 160e are represented as solid lines, whilst the analysis results from the interpolating-process executing unit 160c are represented as broken lines.

In a graph 200*b*, a plurality of wiring components (circuit-element power-supply wiring component L values) and a signal (operation frequency) are set as input conditions, and a maximum voltage value (circuit-element power-supply end) is set as an output condition.

In a graph 200*c*, a plurality of signals (operation frequencies) and a plurality of load capacitances (reception end) are set as input conditions, and a maximum voltage value (reception end) is set as an output condition.

In a graph 200*d*, a plurality of voltage values (circuit-element power-supply voltages) and a plurality of signals (operation frequencies) are set as input conditions, and a maximum current value (circuit-element power-supply terminal) as an output condition. Here, the analysis results from the analysis-SPICE-file executing unit 160*e* are represented as solid lines, whilst the analysis results from the interpolating-process executing unit 160*c* are represented as broken lines.

In a graph 200*e*, a plurality of temperatures are set as input conditions, and a voltage value (reception end) and time are set as output conditions. Here, the analysis results from the analysis-SPICE-file executing unit 160*e* are represented as solid lines, whilst the analysis result from the interpolating-process executing unit 160*c* is represented as a broken line.

In a graph 200*f*, a plurality of circuit-element types and a plurality of signals (operation frequencies) are set as input condition, and a maximum current value (circuit-element power-supply terminal) is set as an output condition.

In this manner, once the user sets input conditions and output conditions, the analysis results are output by the analysis-result output unit 160*g* according to the set input conditions and output conditions. Therefore, comparisons in operation state and characteristic for each design condition and operation condition at the time of design development of internal UNIT cells and input/output (IO) cells can be facilitated. Also, a selection of an optimum circuit element with Large-Scale Integration (LSI) design conditions can be facilitated. Also, a portion required to be improved can be specified from problems, such as timings and noises, and indicators of an improving method can be defined.

Figure 15:
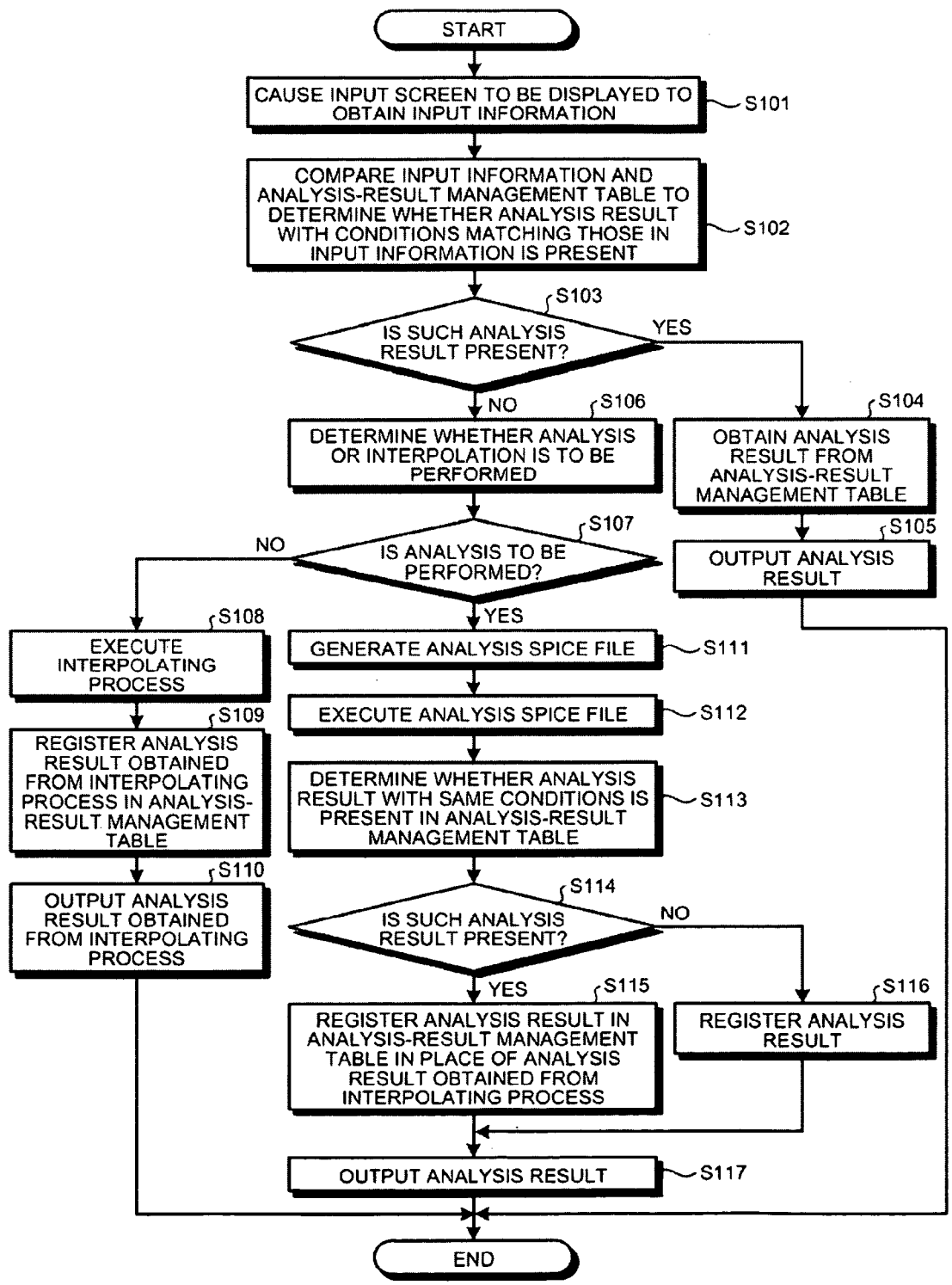
FIG. 15 is a flowchart of a process procedure of the analyzing apparatus according to the present embodiment.

Next, a process procedure of the analyzing apparatus 100 according to the present embodiment is explained. FIG. 15 is a flowchart of a process procedure of the analyzing apparatus 100 according to the present embodiment. As depicted in FIG. 15, in the analyzing apparatus 100, the input accepting unit 160*a* causes an input screen (refer to FIG. 8) to be displayed to obtain input information (step S101), and the input-information determining unit 160*b* compares the input information and the analysis-result management table 150*c* to determine whether an analysis result with conditions matching those contained in the input information is present (step S102).

When the analysis result with conditions matching those contained in the input information is present in the analysis-result management table 150*c* (Yes at step S103), the analysis result is obtained from the analysis-result management table 150*c* (step S104), and the analysis-result output unit 160*g* then outputs the analysis result (step S105).

On the other hand, when the analysis result with conditions matching those contained in the input information is not present in the analysis-result management table 150*c* (No at step S103), it is determined whether an analysis by a simulation (the analysis-SPICE-file executing unit 160*e*) or interpolation is to be performed (step S106).

When interpolation is to be performed (No at step S107), the interpolating-process executing unit 160*c* executes an interpolating process (step S108) and then registers the analysis result obtained from the interpolating process in the analysis-result management table 150*c* (step S109), and the analysis-result output unit 160*g* then outputs the analysis result obtained from the interpolating process (step 110).

Meanwhile, when an analysis by a simulation is to be performed (Yes at step S107), the analysis-SPICE-file generating unit 160*d* generates the analysis SPICE file 150*d* (step S111), and the analysis-SPICE-file executing unit 160*e* executes the analysis SPICE file 150*d*, thereby analyzing the circuit element to be analyzed (step S112).

Then, the table updating unit 160*f* determines whether the analysis result with the same conditions (analysis result obtained from the interpolating process) is present in the analysis-result management table 150*c* (step S113). When the analysis result with the same conditions is present in the analysis-result management table 150*c* (Yes at step S114), the analysis result obtained from the analysis-SPICE-file executing unit 160*e* is registered in the analysis-result management table 150*c* in place of the analysis result obtained from the interpolating process (step S115), and then the analysis result is output (step S117).

On the other hand, when the analysis result with the same conditions is not present in the analysis-result management table 150*c* (No at step S114), the analysis result is registered in the analysis-result management table 150*c* (step S116), and the procedure then goes to step S117.

As has been explained in the foregoing, in the analyzing apparatus 100 according to the present embodiment, the input accepting unit 160*a* accepts input information containing analysis conditions for a circuit element (circuit) to be analyzed, the analysis-SPICE-file generating unit 160*d* generates the analysis SPICE file 150*d* based on the input information, the analysis-SPICE-file executing unit 160*e* executes the analysis SPICE file 150*d*, thereby analyzing the characteristic of the circuit element. Therefore, the analysis SPICE file 150*d*, which has to be generated by the user himself or herself with expertise in the conventional technologies, can be automatically generated. Thus, even a user without expertise can easily analyze the characteristic of the circuit element under a non-specific condition.

Also, in the analyzing apparatus 100 according to the present embodiment, the input-information determining unit 160*d* refers to the analysis conditions contained in the input information. When the analysis conditions identical to the analysis conditions in the input information are registered in the analysis-result management table 150*c*, data associated with the registered analysis conditions is output as an analysis result. Therefore, a burden of executing a simulation or an interpolating process can be eliminated, and the time for the analysis process can be reduced.

Furthermore, in the analyzing apparatus 100 according to the present embodiment, when information indicating that an interpolating process is to be executed is contained in the input information, the interpolating-process executing unit 160*c* calculates the analysis result of the circuit element through an interpolating process. Therefore, even when the analysis conditions identical to those in the input information are not registered in the analysis-result management table 150*c*, a burden of generating the analysis SPICE file 150*d* can be eliminated, and the time for an analysis process can be reduced.

Still further, in the analyzing apparatus 100 according to the present embodiment, in the analysis-result management table 150*c*, the table updating unit 160*f* updates the analysis result calculated by the interpolating-process executing unit 160*c* with the analysis result obtained from the analysis- SPICE-file executing unit 160e. Therefore, the accuracy of the analysis result stored in the analysis-result management table 150c can be increased.

Here, the input conditions of the circuit element to be analyzed accepted by the input accepting unit 160a are not restricted to those explained above. For example, the input conditions of the circuit element to be analyzed may include: net list information, such as SPICE or IBIS of a circuit element configured of a transistor or a circuit element configured of a transistor and a passive element; a constant voltage, such as a DC power supply; an AC voltage; a composite power-supply voltage, such as DC voltage+AC voltage; electric characteristics of a conductor accompanying a package, such as a lead frame of a package, a bonding wire, and an external pin; the type of an input waveform, such as a square wave, a trapezoidal wave, a triangular wave, a sawtooth wave, a sine wave, a Gaussian pulse, and a random pulse; an external factor, such as temperature; a transistor characteristic caused by variations in manufacturing, a conductivity due to the difference in material of the conductor; a skin effect due to the operation frequency; and an electric characteristic, such as dielectric loss.

Meanwhile, among the processes explained in the embodiments, all or part of the processes explained as being automatically performed may be manually performed, or all or part of the processes explained as being manually performed may be automatically performed through a known method. In addition, the process procedure, the control procedure, specific names, and information including various data and parameters explained in the specification and depicted in the drawings can be arbitrarily changed unless otherwise specified.

Furthermore, each component of the analyzing apparatus 100 depicted in FIG. 1 is conceptual in function, and is not necessarily physically configured as depicted. That is, the specific patterns of distribution and unification of the components are not meant to be restricted to those depicted in the drawings. All or part of the components can be functionally or physically distributed or unified in arbitrary units according to various loads and the state of use. Still further, all or arbitrary part of the process functions performed in each component can be achieved by a (Central Processing Unit) CPU and a program analyzed and executed on that CPU, or can be achieved as hardware with a wired logic.

Figure 16:
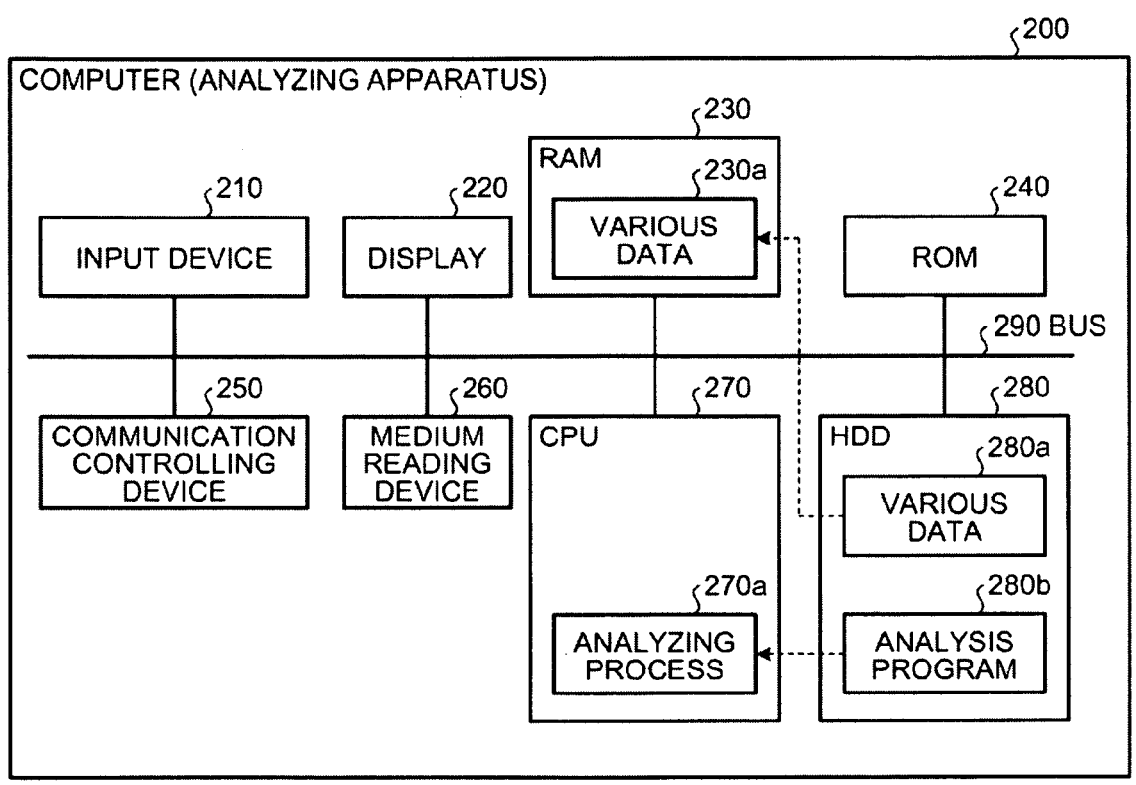
FIG. 16 is a drawing of a hardware configuration of a computer configuring the analyzing apparatus according to the present embodiment.

FIG. 16 is a drawing of a hardware configuration of a computer 200 configuring the analyzing apparatus 100 according to the present embodiment. As depicted in FIG. 16, the computer (analyzing apparatus) 200 includes an input device 210, a display 220, a RAM (random access memory) 230, a ROM (read only memory) 240, a communication controlling device 250 that communicates with another devices, a medium reading device 260 that reads data from a storage medium, a CPU 270, and an HDD (hard disk drive) 280, which are connected to each other via a bus 290.

In the HDD 280, an analysis program 280b achieving a function similar to that of the analyzing apparatus 100 is stored. With the CPU 270 reading and executing the analysis program 280b, an analyzing process 270a is started. Here, the analyzing process 270a corresponds to the input accepting unit 160a, the input-information determining unit 160b, the interpolating-process executing unit 160c, the analysis-SPICE-file generating unit 160d, the analysis-SPICE-file executing unit 160e, the table updating unit 160f, and the analysis-result output unit 160g depicted in FIG. 1.

Also, in the HDD 280, various data 280a corresponding to the analysis condition table 150a, the condition combination table 150b, the analysis-result management table 150c, the analysis SPICE file 150d, and the connection condition table 150e depicted in FIG. 1 is stored. The CPU 270 reads the various data 280a stored in the HDD 280 and stores the read various data 280a in the RAM 230. Also, the CPU 270 uses various data 230a stored in the RAM 230 to execute an analysis of a circuit element (circuit) to be analyzed.

Meanwhile, the analysis program 280b depicted in FIG. 16 is not necessarily stored in the HDD 280 from the start. For example, the analysis program 280b may be stored in a "portable physical medium" inserted into the computer, such as an FD (flexible disk), a CD-ROM (compact-disk read only memory), a DVD (digital versatile disk) disk, a magneto-optical disk, and an IC (integrated circuit) card, a "fixed physical medium", such as an HDD (hard disk drive) provided inside or outside of the computer and, furthermore, "another computer (or server)" connected to the computer via a public line, the Internet, a LAN (local area network), or a WAN (wide area network), for example, and then the analysis program 280b may be read from any of these for execution by the computer.

According to the analyzing apparatus of the embodiments, when an input of an analysis condition is accepted, an analysis file for analyzing the characteristic of a circuit element is automatically generated and executed. Therefore, even users without expertise can easily analyze the characteristic of the circuit element under a non-specific condition.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. An analyzing apparatus comprising:
an analysis-condition accepting unit that accepts an analysis condition for a circuit element to be analyzed;
an analysis-purpose-file generating unit that generates an analysis-purpose file based on the analysis condition, the analysis-purpose file being generated to perform simulation of the circuit element;
an analyzing unit that analyzes the circuit element by executing the analysis-purpose file generated by the analysis-purpose-file generating unit and outputs a first analysis result;
a registering unit that registers, in a storage unit, the first analysis result associated with the analysis condition;
an interpolating unit that executes an interpolating process based on the first analysis result stored in the storage unit to obtain a second analysis result for the circuit element and registers, in the storage unit, the second analysis result associated with the analysis condition; and
an outputting unit that outputs analysis result of the circuit element registered in the storage unit, wherein
the registering unit, when the second analysis result associated with the analysis condition of the first analysis result output by the analyzing unit is registered in the storage unit, updates the registered second analysis result to the first analysis result output by the analyzing unit.

2. The analyzing apparatus according to claim 1, wherein when an analysis condition identical to the analysis condition for the circuit element to be analyzed is registered in the storage unit, the analyzing unit outputs the first analysis result associated with the analysis condition.

3. The analyzing apparatus according to claim 1, wherein the analysis condition has information as to whether an interpolating process is to be executed, and
the interpolating unit executes an interpolating process when the analysis condition contains information indicating that an interpolating process is to be executed.

4. An analyzing method comprising:
accepting an analysis condition for a circuit element to be analyzed;
generating an analysis-purpose file based on the analysis condition, the analysis-purpose file being generated to perform simulation of the circuit element;
storing the generated analysis-purpose file in a storage device; and
analyzing the circuit element by executing the analysis-purpose file stored in the storage device, and outputting a first analysis result;
registering, in a storage unit, the first analysis result associated with the analysis condition;
executing an interpolating process based on the first analysis result stored in the storage unit to obtain a second analysis result for the circuit element and registers, in the storage unit, the second analysis result associated with the analysis condition; and
outputting analysis result of the circuit element registered in the storage unit, wherein
the registering includes updating, when the second analysis result associated with the analysis condition of the first analysis result output by the analyzing is registered in the storage unit, the registered second analysis result to the first analysis result output by the analyzing.

5. The analyzing method according to claim 4, wherein when an analysis condition identical to the analysis condition for the circuit element to be analyzed is stored in the storage device, the first analysis result associated with the analysis condition is output.

6. The analyzing method according to claim 4, wherein the analysis condition has information as to whether an interpolating process is to be executed, and
the executing includes executing an interpolating process when the analysis condition contains information indicating that an interpolating process is to be executed, the interpolating process.

7. A non-transitory computer readable storage medium containing instructions that, when executed by a computer, causes the computer to perform:
accepting an analysis condition for a circuit element to be analyzed;
generating an analysis-purpose file based on the analysis condition, the analysis-purpose file being generated to perform simulation of the circuit element;
storing the generated analysis-purpose file in a storage device; and
analyzing the circuit element by executing the analysis-purpose file stored in the storage device, and outputting a first analysis result;
registering, in a storage unit, the first analysis result associated with the analysis condition;
executing an interpolating process based on the first analysis result stored in the storage unit to obtain a second analysis result for the circuit element and registers, in the storage unit, the second analysis result associated with the analysis condition; and
outputting analysis result of the circuit element registered in the storage unit, wherein
the registering includes updating, when the second analysis result associated with the analysis condition of the first analysis result output by the analyzing is registered in the storage unit, the registered second analysis result to the first analysis result output by the analyzing.

8. The computer readable storage medium according to claim 7, wherein
when an analysis condition identical to the analysis condition for the circuit element to be analyzed is stored in the storage device, the first analysis result associated with the analysis condition is output.

9. The computer readable storage medium according to claim 7, wherein
the analysis condition has information as to whether an interpolating process is to be executed, and
the executing includes executing an interpolating process when the analysis condition contains information indicating that an interpolating process is to be executed, the interpolating process.

* * * * *